United States Patent [19]

Shimoda et al.

[11] Patent Number: 4,810,934

[45] Date of Patent: Mar. 7, 1989

[54] ELECTRON EMISSION DEVICE

[75] Inventors: Isamu Shimoda, Zama; Takeo Tsukamoto, Atsugi; Akira Shimizu, Sagamihara; Akira Suzuki, Yokohama; Masao Sugata, Yokohama; Masahiko Okunuki, Tokyo, all of Japan

[73] Assignee: Canon Kabushiki Kaisha, Tokyo, Japan

[21] Appl. No.: 50,028

[22] Filed: May 15, 1987

[30] Foreign Application Priority Data

| | | | |
|---|---|---|---|
| May 20, 1986 | [JP] | Japan | 61-113517 |
| May 20, 1986 | [JP] | Japan | 61-113518 |
| Nov. 27, 1986 | [JP] | Japan | 61-280831 |

[51] Int. Cl.[4] ........................ H01J 19/24; H01L 29/00

[52] U.S. Cl. .................................... 315/107; 315/117; 315/158; 313/352; 313/446

[58] Field of Search ............... 315/107, 307, 117, 157, 315/158; 322/2; 313/446, 352

[56] References Cited

U.S. PATENT DOCUMENTS

| | | | |
|---|---|---|---|
| T961,002 | 8/1977 | Hall | 315/307 |
| 2,149,080 | 2/1939 | Wolff | 315/107 |
| 2,677,787 | 5/1954 | Litton | 315/107 |
| 3,936,756 | 2/1976 | Someya et al. | 315/107 |
| 4,156,166 | 5/1979 | Shapiro et al. | 315/307 |
| 4,247,801 | 1/1981 | Dallos et al. | 315/107 |

*Primary Examiner*—David K. Moore
*Assistant Examiner*—Mark R. Powell
*Attorney, Agent, or Firm*—Fitzpatrick, Cella, Harper, Cella

[57] ABSTRACT

An electron emission device for attracting electrons emitted from an electron emission element to an anode, includes a current detector for detecting a flow-in current to said electron emission element and a flow-out current from the electron emission element. The difference between the flow-in current and the flow-out current is calculated and the voltage applied to the electron emission element is adjusted in accordance with the difference between the flow-in current and the flow-out cuttent.

14 Claims, 6 Drawing Sheets

ELECTRON EMISSION DEVICE

BACKGROUND OF THE INVENTION

1. Field of the Invention

The present invention relates to an electron emission device, and more particularly to an electron emission device having an electron emission element which emits electrons by application of a voltage and an anode electrode which absorbs the emitted electrons.

2. Related Background Art

In a prior art electron emission device, one of various electron emission elements to be described later is used and electrons emitted thereby are attracted by an anode electrode to form an electron flow.

The electron emission element used is one which uses an avalanche breakdown of a PN junction (PN-A type), one which injects electrons into a P layer by applying a forward bias to a PN junction (PN-B type), one which has a thin insulation layer sandwiched by metal layers (MIM type), an electric field emission type element or a surface conduction type element.

FIG. 1A shows a forward bias is applied to a PN junction to inject electrons into a P layer, and FIG. 1B shows a current-voltage characteristic thereof.

In FIG. 1A, when a forward bias V is applied to the PN junction, a forward current I follows as shown in FIG. 1B, and the electrons injected from an N layer 102 to a P layer 101 are emitted from a surface 103 of the P layer into vacuum. On the surface of the P layer, a work function reducing material 104 such as cesium Cs is applied in order to increase the amount of electron emission.

FIG. 2 shows an MIM type electron emission element, and FIG. 3 shows a surface conduction type electron emission element.

The MIM type electron emission element has a laminated structure of a metal electrode 201, an insulation layer 202 and a thin metal electrode 203. By applying a voltage across the electrodes 201 and 203, electrons are emitted from the thin electrode 203.

The surface conduction type electron emission element has electrodes 302 and 303 formed on an insulative substrate 301 and a high resistance thin film 304 formed therebetween. By applying a voltage between the electrodes 302 and 303, electrons are emitted from the surface of the high resistance thin film 304.

FIG. 4 shows a prior art electron emission device which uses an electron emission element as shown in FIG. 1A. As shown in FIG. 4, a voltage V1 is applied to the electron emission element 401 by a power supply 403 and the emitted electrons are attracted to an anode electrode 402 to which a voltage $V_2$ is applied from a power supply 404 to form an electron flow 405.

In such prior art electron emission devices, the amount of electron emission changes with a change of external environment or a change of efficiency of electron emission of the element and hence a stable electron current is not attained. As shown in FIG. 1B, when the application voltage V is higher than $V_f$, the current I changes significantly and it is difficult to stabilize the amount of electron emission.

When the MIM type or surface conduction type electron emission element is used, the change of the current is significant when the applied voltage is higher than a predetermined level and it is difficult to stabilize the electron current, as is the case for the PN type element. Further, since the amount of electron emission changes with the change of external environment and the change of efficiency of electron emission of the element, a stable electron flow is not attained.

The instability of the electron flow is also observed in the element which uses the avalanche breakdown of the PN junction or the electric field type element.

The cesium $C_s$ applied on the electron emission surface in order to lower the work function is an unstable element and causes a change of the amount of electron emission.

SUMMARY OF THE INVENTION

It is a primary object of the present invention to provide an electron emission device which resolves problems encountered in the prior art electron emission devices.

It is another object of the present invention to provide an electron emission device having a stable electron emission characteristic.

It is another object of the present invention to provide an electron emission device which assures a stable amount of electron emission irrespective of a change of external environment and a change of electron emission efficiency of the electron emission element.

DETAILED DESCRIPTION OF THE PREFERRED EMBODIMENTS

Figure 5:
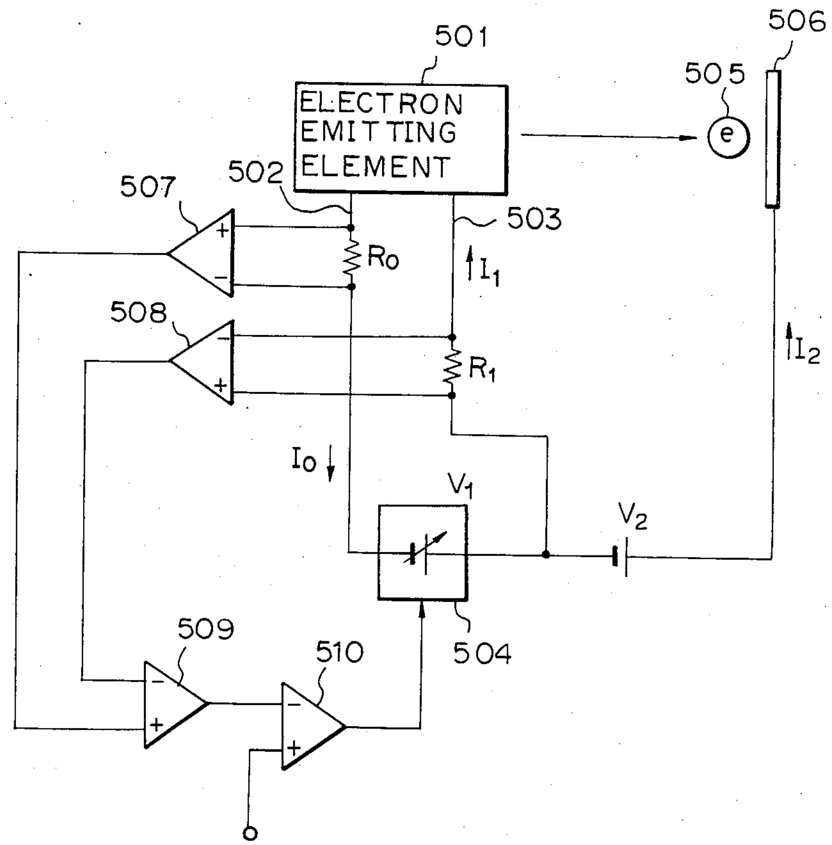
FIG. 5 shows a block diagram of a first embodiment of the electron emission device of the present invention.

FIG. 5 shows a block diagram of one embodiment of the electron emission device of the present invention.

The electron emission device shown in FIG. 5 is constructed to attract electrons emitted from an electron emission element to an anode electrode, an comprises current detection means for detecting a flow-in current to the electron emission device and a flow-out current from the electron emission element, operation means for calculating a difference between the flow-in current and the flow-out current and voltage control means for adjusting a voltage applied to the electron emission element in accordance with the difference between the flow-in current and the flow-out current.

The above construction offers the following effects. The difference between the flow-in current and the flow-out current corresponds to an amount of electron flow emitted from the electron emission element. For example, in FIG. 5, a current $I_2$ which represents the amount of electron flow emitted from the electron emission element 8 is equal to $I_0-I_l$, where $I_0$ is the flow-in current and $I_l$ is the flow-out current. Accordingly, by calculating the difference between the flow-out current and the flow-in current, the amount of electron flow can be indirectly measured, and by adjusting the applied voltage to maintain the difference at a desired constant, a stable amount of electron emission is always attained irrespective of a change of external environment or a change of characteristic of the electron emission element.

Figure 1A:
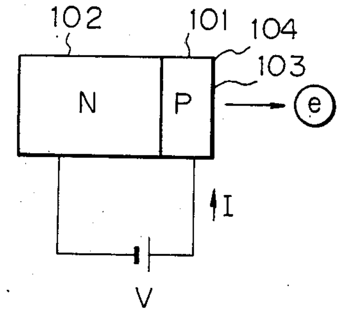
Fig. 1A PRIOR ART
FIG. 1A shows an electron emission element in which a forward bias is applied to a PN junction to inject electrons into a P layer.
Figure 1B:
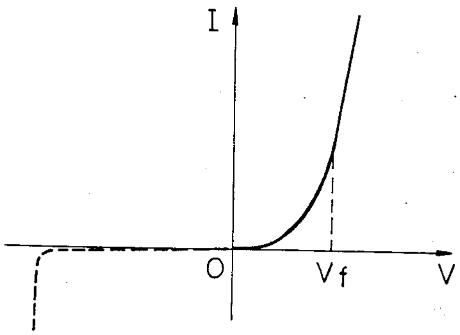
FIG. 1B shows a current-voltage characteristic thereof.
Figure 2:
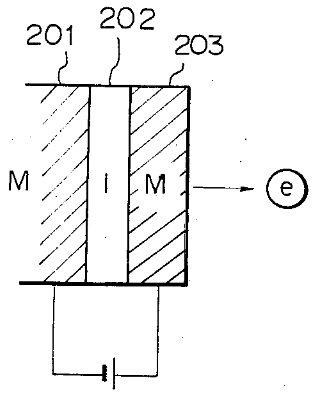
Fig. 2 PRIOR ART
FIG. 2 shows an MIM type electron emission element.
Figure 3:
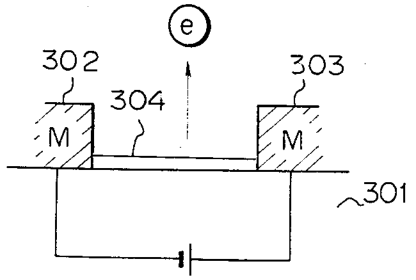
Fig. 3 PRIOR ART
FIG. 3 shows a surface conduction type electron emission element.
Figure 4:
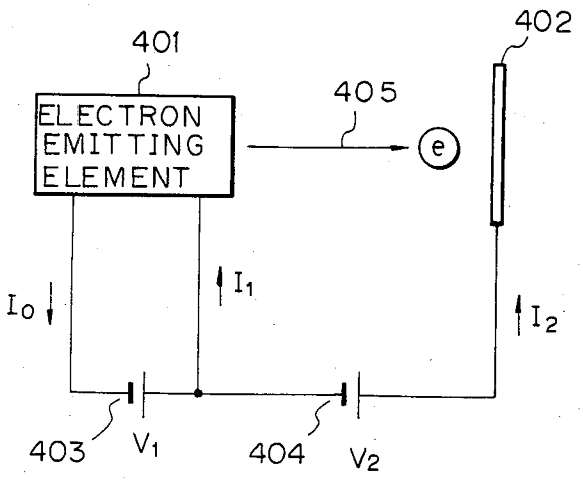
Fig. 4 PRIOR ART
FIG. 4 shows a prior art electron emission device.

The electron emission element 501 shown in FIG. 5 may be a PN junction type, MIM type, surface conduction type or electric field emission type element shown in FIGS. 1A, 2 and 3, whose amount of electron emission can be controlled by the applied voltage. As an example, a PN junction type electron emission element having a forward bias applied thereto is used in the present embodiment.

The electron emission element 501 has electrodes 502 and 503. The current $I_0$ flows out of the electrode 502 and the current $I_l$ flows into the electrode $I_l$. The electrode 502 is connected to a negative electrode of a variable voltage circuit 504 through a resistor $R_0$ and the electrode 503 is connected to a positive electrode of the variable voltage circuit 504 through a resistor $R_l$. Electrons 505 emitted from the electron emission element 501 are attracted to an anode 506 to which a voltage $V_2$ is applied to produce the current $I_2$ which represents the amount of electron flow.

The resistors $R_0$ and $R_l$ are connected across operational amplifiers 507 and 508, respectively, an output terminal of the operational amplifier 507 is connected to a non-inverting input terminal of an operational amplifier 509, and an output terminal of the operational amplifier 508 is connected to an inverting input terminal of the operational amplifier 509. An output amplifier of the operational amplifier 509 is connected to an inverting input terminal of the operational amplifier 510 and a desired set value is applied to a non-inverting input terminal thereof. An output terminal of the operational amplifier 510 is connected to a control terminal of the variable voltage circuit 504 and the voltage $V_l$ of the variable voltage circuit 504 is adjusted by the output of the operational amplifier 510.

The operation of the present embodiment is now explained.

The voltage $V_l$ is applied to the electron emission element 501 by the variable voltage circuit 504 and the constant voltage $V_2$ is applied to the anode 506 so that the currents $I_0$, $I_l$ and $I_2$ flow.

The voltage across the resistors $R_0$ and $R_l$ are given by $I_0R_0$ and $I_lR_l$, respectively, which are applied to the operational amplifier 509 through the operational amplifiers 507 and 508, respectively. If $R_0=R_l=R$, the output of the operational amplifier 509 is given by $$I_0R_0-I_lR_l=R(I_0-I_l)$$

which represents the difference between the currents $I_0$ and $I_l$ and is an indirect measurement of the amount of electron emission. The output of the operational amplifier, which is the measurement of the amount of electron emission, is applied to the inverting input terminal of the operational amplifier 510 and compared with the setting applied to the non-inverting input terminal. The voltage $V_l$ of the variable voltage circuit 504 is adjusted to reduce the difference between the measurement and the setting. As a result, the amount of electron emission is maintained at the desired setting irrespective of the change of environment and the change of efficiency of the electron emission element.

In the present embodiment, the control is effected by varying the voltage $V_l$. Alternatively, both the voltages $V_l$ and $V_2$ may be changed, the easiest control method may be selected depending on the characteristics of the electron emission element 501.

In the electron emission device shown in FIG. 5, the difference between the flow-out current and the flow-in current of the electron emission element is calculated to indirectly measure the amount of the electron flow, and the voltage applied to the electron emission element is adjusted to maintain the measurement at the desired constant. Accordingly, a stable amount of electron emission is always attained irrespective of the change of external environment and the change of characteristics of the electron emission element.

Figure 6:
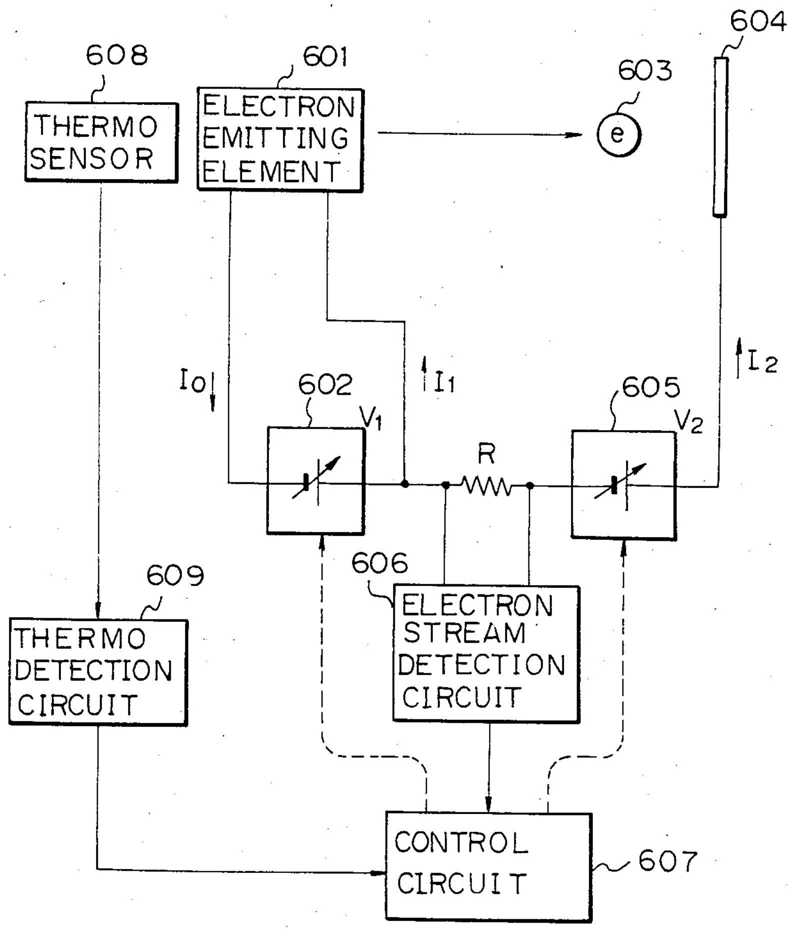
FIG. 6 shows a block diagram of a second embodiment of the electron emission device of the present invention.

FIG. 6 shows a block diagram of a second embodiment of the electron emission device of the present invention.

The electron emission device shown in FIG. 6 is constructed to attract electrons emitted from an electron emission element to an anode, and comprises electron flow detection means for detecting an amount of electron flow emitted from the electron emission element, and voltage control means for adjusting at least one of a voltage applied to the electron emission element and a voltage applied to the anode in accordance with an output of the electron flow detection means.

The electron emission device of the present embodiment detects the amount of electron flow emitted from the electron emission element and adjusts the voltage applied to the electron emission element and/or the voltage applied to the anode voltage to maintain the measurement of the current flow at a constant value. As a result, a stable amount of electron emission is always attained irrespective of a change of external environment and a change of characteristics of the electron emission element.

The electron emission element 601 shown in FIG. 6 may be of a PN junction type, MIM type, surface conduction type or electric field emission type, as is the embodiment of FIG. 5, which controls the amount of electron emission by the applied voltage. As an example, a PN junction type electron emission element which uses a forward bias is used in the present embodiment.

A voltage $V_l$ is applied to an electron emission element 601 by a variable voltage circuit 602 so that electrons 603 are emitted thereby and attracted to the anode 604. A voltage $V_2$ is applied to the anode 604 by a variable voltage circuit 605.

A positive electrode of the variable voltage circuit 602 and a negative electrode of the variable voltage circuit 605 are connected through an electron flow detection resistor R. The resistor R is connected across an electron flow detection circuit 606, and a detection output thereof is applied to a control circuit 607. The control circuit 607 produces control signals to the variable voltage circuits 602 and 605 in accordance with the detection output to vary the voltage $V_1$ and/or $V_2$.

The operation of the present embodiment is now explained.

The voltage $V_1$ is applied to the electron emission element 601 by the variable voltage circuit 602 and the voltage $V_2$ is applied to the anode 604 by the variable voltage circuit 605. As a result, a current $I_0$ flows out of the electron emission element 601 and a current $I_1$ flows thereinto, and the electrons 603 are emitted from the electron emission element 601 to the anode 604. This electron flow is attracted to the anode 604 so that a current $I_2$ which represents the amount of electron flow flows through the resistor R. By detecting the voltage developed across the resistor R the amount of electron flow can be detected.

The control circuit 607 receives the detection signal from the electron flow detection circuit 606 and supplies the control signals to the variable voltage circuits 602 and/or 605 to reduce a difference from a present reference signal. If the amount of electron emission decreases by some reason, the current $I_2$ decreases and the detection signal from the electron flow detection circuit 606 varies. The control circuit 607 detects the decrease of the amount of electron emission by the difference from the reference signal due to the change of detection signal, and raises the voltage $V_1$ or the applied voltage $V_2$ of the anode 604 to increase the amount of electron emission. Of course, both the voltages $V_1$ and $V_2$ may be raised. The easiest control method may be selected depending on the characteristic of the electron emission element 601.

Since the electron emission element 601 is not of thermal electron emission type, the amount of heat generation is very low. The stability of the electron flow can be further improved by providing means to reduce affect by heat.

For example, as shown in FIG. 6, a thermo-sensor 608 is provided for the electron emission element 601 and the output of the thermo-sensor 608 is supplied to the control circuit 607 through a thermo-detection circuit. The control circuit 607 receives the detection signal from the electron flow detection circuit 606 and the thermo-detection signal from the thermo-detection circuit 609 and adjusts the voltages $V_1$ and/or $V_2$ in accordance with those detection signals.

Since the temperature of the electron emission element 601 is always monitored, overheating of the element is prevented and the affect of heat is minimized.

The electron emission device shown in FIG. 6 detects the amount of electron flow emitted from the electron emission element, and the voltage applied to the electron emission element and/or the voltage applied to the anode are adjusted to maintain the detected amount at the constant level. Accordingly, stable electron emission is always attained irrespective of the change of external environment and he change of characteristic of the electron emission element.

Even if an unstable material such as cesium is formed on the emission surface in order to reduce a work function and increase the amount of electron emission, the stable electron emission is attained by the present invention.

Figure 7:
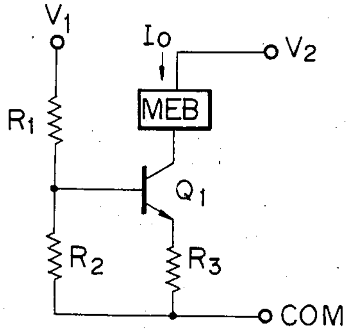
FIG. 7 shows a circuit of a third embodiment of the electron emission device of the present invention.

FIG. 7 shows a circuit of a third embodiment of the electron emission device of the present invention.

In the present embodiment, a voltage is divided by resistors $R_1$ and $R_2$ and the divided voltage is applied to a base of a transistor $Q_1$ to bias it in order to maintain a constant current. A drive current $I_0$ for an electron emission element MEB is determined by the resistors $R_1$, $R_2$ and $R_3$, an applied voltage $V_1$ and a base voltage $V_{BE}$ of the transistor $Q_1$ and represented as follows.

$$I_0 \approx \frac{V_1\{R_2/(R_1 + R_2)\} - V_{BE}}{R_3}$$

By fabricating the transistor $Q_1$ and the resistor $R_3$ integrally, the affect of the thermal coefficient can be reduced.

Figure 8:
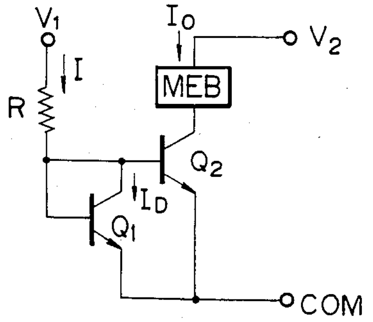
FIG. 8 shows a circuit of a fourth embodiment of the electron emission device of the present invention.

FIG. 8 shows a circuit of a fourth embodiment of the electron emission device of the present invention.

The present embodiment is an electron emission device which uses a current mirror type constant current circuit, which improves the thermal coefficient in the third embodiment.

As shown in FIG. 8, a collector of a base-collector shorted transistor $Q_1$ is connected to a base of a transistor $Q_2$, and an emitter of the transistor $Q_1$ is connected to an emitter of the transistor $Q_2$, and a base-emitter forward voltage of the transistor $Q_1$ is applied to the transistor $Q_2$ to bias it.

A current I is supplied through a resistor R and it flows into the base and collector of the transistor $Q_1$, which is biased so that a collector current $I_D$ is substantially equal to the current I, and a base voltage $V_{BE}$ is developed. This base voltage $V_{BE}$ is applied to the base of the transistor $Q_2$ to bias it so that the transistor $Q_2$ supplies a constant current. The current $I_0$ which flows through the electron emission element MEB is given by $$I_0 \approx I_D = \frac{V_1 - V_{BE}}{R}$$

if $V_1 >> V_{BE}$, the change of $V_{BE}$ by the temperature can be reduced and $I_0$ is stabilized.

The electron emission device of the present embodiment controls the current of the electron emission element at the constant level. The constant current control may be effected by an external signal.

Figure 9:
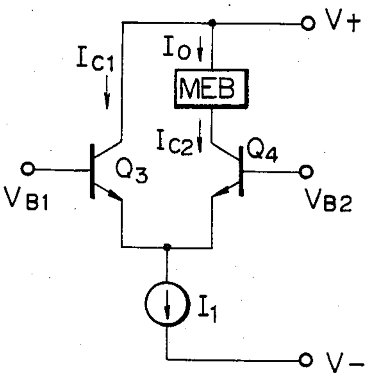
FIG. 9 shows a circuit of a fifth embodiment of the electron, emission device of the present invention.
Figure 10:
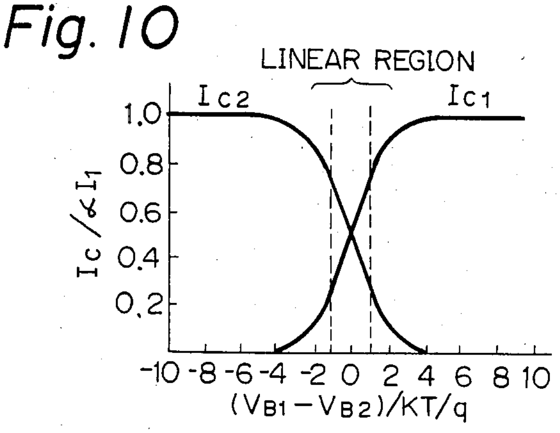
FIG. 10 shows a transfer characteristic of the electron emission device.

FIG. 9 shows a circuit of an embodiment of the electron emission device which is controlled by an external signal, and FIG. 10 shows a transfer characteristic thereof.

As shown in FIG. 9, in the present embodiment, transistors $Q_3$ and $Q_4$ are provided laterally symmetrically. A collector current $I_{c1}$ which flows through the transistor $Q_3$ and a drive current $I_0$ which flows through an electron emission element MEB are controlled by external signal voltages $V_{B1}$ and $V_{B2}$, and the currents which flow out of the transistors $Q_3$ and $Q_4$ are maintained at a constant value ($I_1 = I_0 + I_{c1}$) by a constant current circuit. The electron emission device of the present invention is of differential amplifier type, and the external signal voltages $V_{B1}$ and $V_{B2}$ and the collector currents $I_{c1}$ and $I_{c2}$ of the transistors $Q_3$ and $Q_4$ have the following relationship.

$$I_{c2} = -I_{c1} = \frac{\alpha I_1}{1 + \exp\frac{q(V_{r1} - V_{n2})}{kT}}$$

where k: Boltzman's constant

T: absolute temperature q: charge of electrons $I_{cl}=\alpha I_{El}$, $I_{c2}=\alpha I_{E2}$ $I_{El}$, $I_{E2}$: emitter currents of the transistors $Q_3$ and $Q_4$, respectively.

The above relationship is illustrated by a graph in FIG. 10. As shown, if the differential input voltage ratio ($V_{Bl}-V_{B2}$) exceeds $\pm 4kT/q$ (approximately 100 mV, T: absolute temperature, q: charge of electrons), that is, if $$\left| \frac{q(V_{B1} - V_{B2})}{kT} \right| > 4,$$

the collector current $I_{cl}$ or $I_{c2}$ is rendered constant. Namely, in the electron emission device of the present embodiment shown in FIG. 9, the current of the electron emission element is kept constant so long as $(V_{Bl}-V_{B2}) < -4kT/q$. The current is thus determined only by the constant current source $I_l$ and is not affected by the change of characteristic of $Q_3$ and $Q_4$ by the temperature.

When $-4kT < q < (V_{Bl}-V_{B2}) < 4kT/q$, the drive current $I_0$ for the electron emission element can be controlled by the external signal voltage difference $V_{Bl}-V_{B2}$. When $(V_{Bl}-V_{B2}) > 4kT/q$, the drive current $I_0$ of the electron emission element is blocked.

In the electron emission device shown in FIG. 9, the change of current because of external temperature is prevented and the electron emission element can be stably driven. Accordingly, the amount of electron emission is stabilized, the peripheral circuit is protected, and the reliability of the electron emission device is significantly improved.

By providing current control means for controlling the current which flows through the electron emission element by the external signal, to the electron emission devices shown in FIGS. 7 to 9, the amount of electron emission of theeelectron emission element is controlled.

In the electron emission device of the present invention, heat carrier means may be provided in order to carry the heat generated by the electron emission element to other portion to prevent unstable electron carriage due to thermal affect of the electron emission element.

Figure 11:
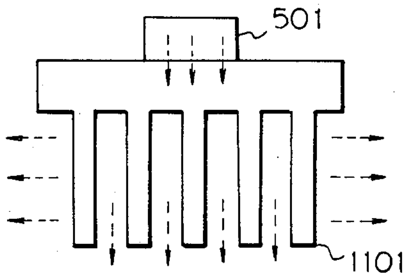
FIG. 11 shows major portions of a sixth embodiment of the electron emission device of the present invention.
Figure 12:
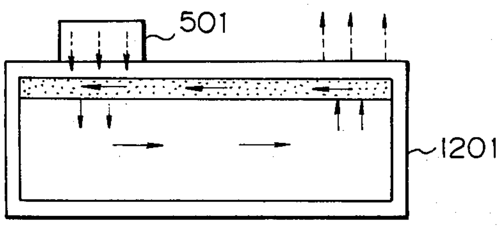
FIG. 12 shows major portions of a seventh embodiment of the electron emission device of the present invention.
Figure 13:
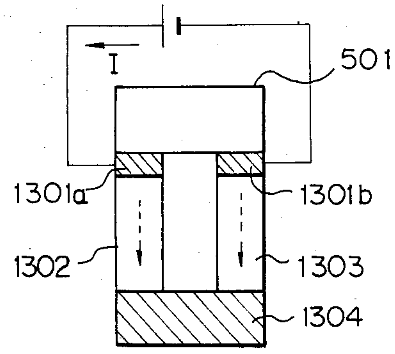
FIG. 13 shows major portions of an eighth embodiment of the electron emission device of the present invention.

FIGS. 11 to 13 show embodiments which are provided with such heat carrier means in the electron emission elements (typically 501 in FIG. 5) of the electron emission devices shown in FIGS. 5 to 9.

FIG. 11 shows major portions of a sixth embodiment of the electron emission device of the present invention.

As shown, an electron emission element 501 is connected to a heat sink 1101, and heat emitted from the electron emission element 501 is conducted to the heat sink 1101 (heat is shown by broken lines), which is cooled by air.

The heat sink is preferably Al from the standpoint of weight and thermal conductivity. As shown, the heat sink 1101 has fins to enhance its heat sink efficiency.

FIG. 12 shows the major portion of a seventh embodiment of the electron emission device of the present invention.

As shown, an electron emission element 501 is connected to an end of a heat pipe 1201, which is a pipe-shaped or plate-shaped hollow container having a porous material layer having a capillary action formed on an inner wall and liquid is added and sealed therein.

As the end of the heat pipe 1201 is heated by the heat emitted from the electron emission element 501, the liquid is evaporated to absorb the heat, and when the vapor flows to the other end of the pipe, it is cooled and condensed to dissipate heat, and the liquid returns to the heating end by the capillary action.

FIG. 13 shows the major portion of an eighth embodiment of the electron emission device of the present invention.

As shown, an electron emission element 501 is connected to electrodes 1301*a* and 1301*b* of a Peltier element which serves as cooling means. A voltage is applied between electrodes 301*a* and 301*b* to flow a current I through the electrode 1301*a*, an N type semiconductor 1302, a metal 1304 (which serves as heat absorber), a P type semiconductor 1303 and the electrode 1301*b*. Thus, the heat is removed from the electron emission element 501 by the Peltier effect so that the electron emission element 501 is colled. By the use of the Peltier element, the temperature of the electron emission element 501 may be lowered below an environment temperature.

In the electron emission devices shown in FIGS. 11 to 13, means for carrying the heat from the electron emission element such as heat sink, water cooling means or oil cooling means which use metal or liquid having a high thermal conductivity, means such as heat pipe for dissipating heat by evaporation and condensation of liquid, or cooling means such as Peltier element is used to escape the heat generated by the electron emission element or remove the heat of the electron emission element to keep the electron emission element at or below the environment temperature. Further, the affect to the peripheral circuit which drives the electron emission element is reduced. Accordingly, the electron emission efficiency is improved and the electron emission is stabilized. In the semiconductor electron emission element in which the forward bias is applied to the PN junction to inject electrons into the P layer, an efficiency $\eta$ to reach the surface of the semiconductor is represented by $$\eta \alpha \epsilon^{V/kT}$$

where

V: bias voltage k: Boltzman's constant

T: absolute temperature

Thus, by lowering the absolute temperature T, the efficiency $\eta$ is improved and the electron emission efficiency is improved.

In the electron emission element having a work function reducing material such as an alkaline metal (e.g. Cs) formed on the electron emission surface, the evaporation rate of the work function reducing material increases as the temperature of the electron emission element rises. However, in the present invention, the durability is extended because the electron emission element is kept at or below the environment temperature.

In the electron emission devices shown in FIGS. 11 to 13, the temperature of the electron emission element is kept at the constant temperature and the affect to the peripheral circuit which drives the electron emission element can be reduced. Accordingly, the electron emission efficiency is further improved and the electron emission is stabilized.

The embodiments shown in FIGS. 11 to 13 can be suitably used with a multiple-emitter electron emission device having a plurality of electron emitters. Packing density is improved and a high resolution multiple-emitter electron emission device is attained.

We claim:

1. An electron emission device for attracting electrons emitted from an electron emission element to an anode, comprising:
current detection means for detecting a flow-in current to said electron emission element and a flow-out current from said electron emission element;
operation means for calculating a difference between the flow-in current and the flow-out current; and
voltage control means for adjusting a voltage applied to said electron emission element in accordance with the difference between the flow-in current and the flow-out current.

2. An electron emission device according to claim 1 wherein said electron emission element is of a PN junction type.

3. An electron emission device according to claim 1 wherein said electron emission element is of an MIM type.

4. An electron emission device according to claim 1 wherein said electron emission element is of a surface conduction type.

5. An electron emission device according to claim 1 wherein said electron emission element is of an electric field emission type.

6. An electron emission device for attracting electrons emitted by an electron emission element to an anode, comprising:
electron flow detection means for detecting an amount of electron flow emitted from said electron emission element; and
voltage control means for adjusting at least one of a voltage applied to said electron emission element and a voltage applied to said anode in accordance with the output of said electron flow detection means.

7. An electron emission device according to claim 6 wherein said electron emission element is of a PN junction type.

8. An electron emission device according to claim 6 wherein said electron emission element is of an MIM type.

9. An electron emission device according to claim 6 wherein said electron emission element is of a surface conduction type.

10. An electron emission device according to claim 6 wherein said electron emission element is of an electric field emission type.

11. An electron emission device according to claim 6 further comprising thermo-detection means for detecting a temperature of said electron emission element.

12. An electron emission device according to claim 11 wherein said thermo-detection means includes a thermo-sensor and a thermo-detection circuit.

13. An electron emission device according to claim 1 further comprising heat carrier means.

14. An electron emission device according to claim 6 further comprising heat carrier means.

* * * * *